(12) United States Patent
Vaartstra

(10) Patent No.: US 6,861,353 B2
(45) Date of Patent: *Mar. 1, 2005

(54) METHODS FOR PLANARIZATION OF METAL-CONTAINING SURFACES USING HALOGENS AND HALIDE SALTS

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/771,050

(22) Filed: Feb. 3, 2004

(65) Prior Publication Data

US 2004/0157458 A1 Aug. 12, 2004

Related U.S. Application Data

(63) Continuation of application No. 10/032,049, filed on Dec. 21, 2001, now Pat. No. 6,730,592.

(51) Int. Cl.[7] .......................................... H01L 21/4763
(52) U.S. Cl. ........................ 438/633; 438/693; 257/752
(58) Field of Search ................................ 438/626–633, 438/691–693; 257/750–754

(56) References Cited

U.S. PATENT DOCUMENTS

| 4,035,500 A | 7/1977 | Dafter, Jr. |
| 4,297,436 A | 10/1981 | Kubotera et al. |
| 4,670,306 A | 6/1987 | Salem |

(List continued on next page.)

FOREIGN PATENT DOCUMENTS

| EP | 1 111 083 | 6/2001 |
| EP | 1 123 956 | 8/2001 |
| EP | 1 156 091 | 11/2001 |
| JP | 2000 200782 | 7/2000 |
| WO | WO 98/06541 | 2/1998 |
| WO | WO 98/36045 | 8/1998 |
| WO | WO 99/27581 | 6/1999 |
| WO | WO 99/53532 | 10/1999 |
| WO | WO 00/31794 | 6/2000 |
| WO | WO 01/44396 | 6/2000 |
| WO | WO 00/77107 | 12/2001 |
| WO | WO 02/084718 | 10/2002 |
| WO | WO 03/056620 | 7/2003 |
| WO | WO 03/059571 | 7/2003 |
| WO | WO 03/060028 | 7/2003 |
| WO | WO 03/060980 | 7/2003 |

OTHER PUBLICATIONS

Canterford et al., "Chapter 9: Rhodium and Iridium," *Halides of the Transition Elements, Halides of the Second and Third Raw Transition Metals*, John Wiley & Sons, New York, NY, 1968; pp. 346–357, publication page, title page (14 pages total).

DeOrnellas et al., "Challenges for Plasma Etch Integration of Ferroelectric Capacitors in FeRAM's and DRAM's," *Intergrated Ferroelectrics*, 1997;17:395–402.

DeOrnellas et al., "Plasma Etch of Ferroelectric Capacitors in FeRAMs and DRAMS," *Semiconductor International*, 1997 Sep.; pp. 103–104,106 and 108.

Ginzburg et al., *Analytical Chemistry of Platinum Metals*, John Wiley & Sons, New York, cover pg., and 14–15.

(List continued on next page.)

*Primary Examiner*—Matthew Smith
*Assistant Examiner*—Calvin Lee
(74) *Attorney, Agent, or Firm*—Mueting, Raasch & Gebhardt, P.A.

(57) ABSTRACT

A planarization method includes providing a metal-containing surface (preferably, a Group VIII metal-containing surface, and more preferably a platinum-containing surface) and positioning it for contact with a polishing surface in the presence of a planarization composition that includes a halogen and a halide salt.

53 Claims, 1 Drawing Sheet

U.S. PATENT DOCUMENTS

| | | | |
|---|---|---|---|
| 4,747,907 A | 5/1988 | Acocella et al. |
| 4,992,137 A | 2/1991 | Cathey, Jr. et al. |
| 5,254,217 A | 10/1993 | Maniar et al. |
| 5,318,927 A | 6/1994 | Sandhu et al. |
| 5,378,492 A | 1/1995 | Mashiko |
| 5,380,401 A | 1/1995 | Jones et al. |
| 5,392,189 A | 2/1995 | Fazan et al. |
| 5,480,854 A | 1/1996 | Rajaram et al. |
| 5,527,423 A | 6/1996 | Neville et al. |
| 5,575,885 A | 11/1996 | Hirabayashi et al. |
| 5,692,950 A | 12/1997 | Rutherford et al. |
| 5,695,384 A | 12/1997 | Beratan |
| 5,700,383 A | 12/1997 | Feller et al. |
| 5,711,851 A | 1/1998 | Blalock et al. |
| 5,786,259 A | 7/1998 | Kang |
| 5,888,906 A | 3/1999 | Sandhu et al. |
| 5,916,855 A | 6/1999 | Avanzino et al. |
| 5,935,871 A | 8/1999 | Farkas et al. |
| 5,954,997 A | 9/1999 | Kaufman et al. |
| 5,958,794 A | 9/1999 | Bruxvoort et al. |
| 5,976,928 A | 11/1999 | Kirlin et al. |
| 5,981,454 A | 11/1999 | Small |
| 5,989,988 A | 11/1999 | Iinuma et al. |
| 6,015,506 A | 1/2000 | Streinz et al. |
| 6,039,633 A | 3/2000 | Chopra |
| 6,045,716 A | 4/2000 | Walsh et al. |
| 6,069,080 A | 5/2000 | James et al. |
| 6,071,816 A | 6/2000 | Watts et al. |
| 6,110,830 A | 8/2000 | Skrovan et al. |
| 6,143,191 A | 11/2000 | Baum et al. |
| 6,143,192 A | 11/2000 | Westmoreland |
| 6,149,828 A | 11/2000 | Vaartstra |
| 6,211,034 B1 | 4/2001 | Visokay et al. |
| 6,261,157 B1 | 7/2001 | Bajaj et al. |
| 6,278,153 B1 | 8/2001 | Kikuchi et al. |
| 6,290,736 B1 | 9/2001 | Evans |
| 6,306,012 B1 | 10/2001 | Sabde |
| 6,346,741 B1 | 2/2002 | Van Buskirk et al. |
| 6,368,518 B1 | 4/2002 | Vaartstra |
| 6,395,194 B1 | 5/2002 | Russell et al. |
| 6,436,723 B1 | 8/2002 | Tomita et al. |
| 6,451,214 B1 | 9/2002 | Westmoreland |
| 6,454,957 B1 | 9/2002 | Westmoreland |
| 6,476,491 B2 | 11/2002 | Harada et al. |
| 6,527,622 B1 | 3/2003 | Brusic et al. |
| 6,527,818 B2 | 3/2003 | Hattori et al. |
| 6,537,462 B1 | 3/2003 | Westmoreland |
| 6,589,100 B2 | 7/2003 | Moeggenborg et al. |
| 6,730,592 B2 | 5/2004 | Vaartstra |
| 6,756,308 B2 | 6/2004 | Small et al. |
| 2001/0006031 A1 | 7/2001 | Tsuchiya et al. |
| 2001/0023701 A1 | 9/2001 | Aoki et al. |
| 2002/0008265 A1 | 1/2002 | Beitel et al. |
| 2002/0017063 A1 | 2/2002 | Beitel et al. |
| 2002/0019088 A1 | 2/2002 | Basceri et al. |
| 2002/0039839 A1 | 4/2002 | Thomas et al. |
| 2002/0050322 A1 | 5/2002 | Kunisawa et al. |
| 2002/0081853 A1 | 6/2002 | Beitel et al. |
| 2002/0111026 A1 | 8/2002 | Small et al. |
| 2002/0111027 A1 | 8/2002 | Sachan et al. |
| 2002/0151177 A1 | 10/2002 | Cherian et al. |
| 2003/0119304 A1 | 6/2003 | Vaartstra |
| 2003/0119316 A1 | 6/2003 | Klein et al. |
| 2003/0119319 A1 | 6/2003 | Sinha et al. |
| 2003/0119321 A1 | 6/2003 | Unhlenbrock et al. |
| 2003/0119426 A1 | 6/2003 | Sabde et al. |
| 2003/0121891 A1 | 7/2003 | Westmoreland |
| 2003/0138561 A1 | 7/2003 | Westmoreland |
| 2003/0166337 A1 | 9/2003 | Wang et al. |

OTHER PUBLICATIONS

Kim et al., "Chemical Dry Etching of Platinum Using $Cl_2/CO$ Gas Mixture," *Chem. Mater.*, 1998; 10:3576–3582.

Kwon et al., "Etching properties of Pt thin films by inductively coupled plasma," *J. Vac. Sci. Technol.*, 1998;A 16(5):2772–6.

Nakao, "Dissolution of Noble Metals in Halogen–Halide–Polar Organic Solvent Systems," *J. Chem. Soc., Chem. Commun.*, Mar. 1, 1992; 5:426–7.

Weast et al., "CRC Handbook of Chemistry and Physics," Chemical Rubber Publishing Company, 1989: D151–154.

Wilberg, *Lehrbuch der Anorganischen Chemie*, Walter de Gruyter, Berlin, 1985, p. 1118 (Translation of First Paragraph Only).

Xu et al., "Chemical Vapor Deposition (CVD) of Iridium and Platinum Films and Gas–Phase Chemical Etching of Iridium Thin Films," *Mat. Res. Soc. Symp. Proc.*, 1999;541:129–139.

Webster's II, New Riverside University Dictionary, 1984: pp. 258,842.

US 6,861,353 B2

METHODS FOR PLANARIZATION OF METAL-CONTAINING SURFACES USING HALOGENS AND HALIDE SALTS

This is a continuation of application Ser. No. 10/032,049, filed Dec. 21, 2001, and issued as U.S. Pat. No. 6,730,592 dated May 4, 2004, which is incorporated herein by reference in its entirety.

FIELD OF THE INVENTION

The present invention relates to methods for planarization of metal-containing (preferably, Group VIII, and more preferably, platinum-containing) surfaces, particularly in the fabrication of semiconductor devices.

BACKGROUND OF THE INVENTION

Films of metals and metal oxides, particularly the heavier elements of Group VIII, are becoming important for a variety of electronic and electrochemical applications. This is at least because many of the Group VIII metal films are generally unreactive, resistant to oxidation or retard the diffusion of oxygen, and are good conductors. Oxides of certain of these metals also possess these properties, although perhaps to a different extent.

Thus, films of Group VIII metals, their alloys, and metal oxides, particularly the second and third row metals (e.g., Ru, Os, Rh, Ir, Pd, and Pt) have suitable properties for a variety of uses in integrated circuits. For example, they can be used in integrated circuits for barrier materials, for example. They are particularly suitable for use as barrier layers between the dielectric material and the silicon substrate in memory devices. Furthermore, they are suitable as the plate (i.e., electrode) itself in capacitors.

Platinum is one of the candidates for use as an electrode for high dielectric capacitors. Capacitors are the basic charge storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs). Thus, there is a continuing need for methods and materials for the processing of Group VIII metal-containing films, preferably, platinum-containing films.

Many surfaces that result during the formation of Group VIII metal-containing films, particularly in the wafer fabrication of semiconductor devices, do not have uniform height, and therefore, the wafer thickness is also non-uniform. Further, surfaces may have defects such as crystal lattice damage, scratches, roughness, or embedded particles of dirt or dust. For various fabrication processes to be performed, such as lithography and etching, height non-uniformities and defects at the surface of the wafer must be reduced or eliminated. Also, excess material may need to be removed to form a structure with selectivity relative to the underlying substrate. Planar removal of a substrate's top surface is also used to isolate certain features electrically. Various planarization techniques are available to provide such reduction and/or elimination. One such planarization technique includes mechanical and/or chemical-mechanical polishing (abbreviated herein as "CMP").

The process of planarization is used to remove material, and preferably achieve a planar surface, over the entire chip and wafer, sometimes referred to as "global planarity." Conventionally, the process of planarization, and particularly CMP, involves the use of a wafer holder that holds a wafer, a polishing pad, and an abrasive slurry that includes a dispersion of a plurality of abrasive particles in a liquid. The abrasive slurry is applied so that it contacts the interface of the wafer and the polishing pad. A table or platen has a polishing pad thereon. The polishing pad is applied to the wafer at a certain pressure to perform the planarization. At least one of the wafer and a polishing pad are set in motion relative to the other. In some planarization processes, the wafer holder may or may not rotate, the table or platen may or may not rotate and/or the platen may be moved in a linear motion as opposed to rotating. There are numerous types of planarization units available which perform the process in different manners. Alternatively, the polishing pad and abrasive slurry may be replaced by a fixed abrasive article that includes a plurality of abrasive particles dispersed within a binder adhered to at least one surface of a backing material.

The planarization of a surface that includes platinum and other Group VIII metals typically involves mechanical polishing, as opposed to chemical-mechanical polishing, because they are relatively chemically inert and/or have relatively few volatile products. Such mechanical polishing uses alumina, silica, or other abrasive particles to remove the metal physically. Unfortunately, mechanical polishing tends to smear (e.g., deform) the metals, leaving metal over undesired portions of the wafer surface, and leaving scratches in either the metal itself or other areas on the wafer surface. Also, many commercially available abrasive slurries do not effectively planarize platinum or other Group VIII metal-containing surfaces either because no material is removed or the resultant surface has defects therein.

Thus, there is still a need for methods for planarizing an exposed surface of a substrate that includes platinum and/or other Group VIII metals, particularly in the fabrication of semiconductor devices.

SUMMARY OF THE INVENTION

The present invention provides methods that overcome many of the problems associated with the planarization of a surface, particularly one that includes platinum, another of the Group VIIIB metals, and/or a Group IB metal. Preferably, the methods of the present invention are effective for the planarization of a surface containing at least one of the second and third row metals of Group VIIIB (i.e., Groups 8, 9, and 10, which includes Rh, Ru, Ir, Pd, Os, and Pt) and Group IB (i.e., Au and Ag). More preferably, the methods of the present invention are effective for the planarization of a surface containing at least one of Rh, Ru, Ir, Pd, and Pt. Such a surface is referred to herein as a "metal-containing surface." That is, a "metal-containing surface" refers to an exposed region having a metal present, preferably at least one metal of Group VIIIB and Group IB present. In such an exposed region, the metal is preferably present in an amount of at least about 10 atomic percent, more preferably at least about 20 atomic percent, and most preferably at least about 50 atomic percent, of the composition of the region, which may be provided as a layer, film, coating, etc., to be planarized (e.g., via chemical-mechanical or mechanical planarization or polishing) in accordance with the present invention. The surface preferably includes one or more Group VIIIB and/or Group IB metals in elemental form or an alloy thereof (with each other and/or one or more other metals of the Periodic Table), as well as oxides, nitrides, and silicides thereof. More preferably, the surface includes (and most preferably, consists essentially of) one or more Group VIIIB and/or Group IB metals in elemental form or an alloy of such metals only.

The methods of the present invention involve planarizing a surface using a planarization composition that preferably includes a halogen-containing compound and a halide salt therein (dissolved or dispersed therein). A preferred group of halogen-containing compounds include the halogens (e.g., $F_2$, $Cl_2$, $Br_2$, and $I_2$), the interhalogens (e.g., ClBr, IBr, ICl, BrF, ClF, $ClF_3$, $BrF_3$, $ClF_5$, $IF_5$, and $IF_7$), and halogen-generating compounds (e.g., $XeF_2$, $HgF_2$, $SF_4$, alkyl halides, and complexes of $X_2$ with organic bases). The halide salts can be inorganic salts (e.g., NaI, KCl, KBr, and $NH_4F$) or organic salts (e.g., $Et_4NBr$, $Me_3NHCl$, and $Me_4NF$).

Herein, as is conventionally understood, "planarizing" or "planarization" refers to the removal of material from a surface, whether it be a large or small amount of material, either mechanically, chemically, or both. This also includes removing material by polishing. As used herein, "chemical-mechanical polishing" and "CMP" refer to a dual mechanism having both a chemical component and a mechanical component, wherein corrosion chemistry and fracture mechanics both play a roll in the removal of material, as in wafer polishing.

Preferably, the halogen-containing compound is present in the composition in an amount of at least about 0.1% by weight, and more preferably, in an amount of no greater than about 50% by weight. Most preferably, the halogen-containing compound is present in the composition in an amount of about 1% to about 10% by weight.

Preferably, the halide salt is present in the composition in an amount of at least about 0.1% by weight, and more preferably, in an amount of no greater than about 50% by weight. Most preferably, the halide salt is present in the composition in an amount of about 1% to about 10% by weight.

The planarization composition can optionally include abrasive particles, thereby resulting in an abrasive slurry, and be used in planarization techniques with conventional polishing pas that do not have abrasive particles embedded therein. Alternatively, the planarization composition without abrasive particles therein can be used with fixed abrasive articles (also referred to as abrasive polishing pads) in place of conventional polishing pads. Such fixed abrasive articles include a plurality of abrasive particles dispersed within a binder adhered to at least one surface of a backing material. If the halogen-containing compound and/or halide salt are not stable in a composition with abrasive particles (i.e., an abrasive slurry), they may be provided by separate delivery systems and/or in separate compositions and mixed at the point of use. Alternatively, the composition may be stabilized by the addition of surfactants, chelating agents, phase transfer catalysts, emulsifiers, or other solvents.

In one aspect of the present invention, a planarization method is provided that includes: positioning a metal-containing surface of a substrate (preferably, a semiconductor substrate or substrate assembly such as a silicon wafer) to interface with a polishing surface; supplying a planarization composition in proximity to the interface; and planarizing the metal-containing surface. The metal-containing surface includes a metal selected from the group consisting of a Group VIIIB metal, a Group IB metal, and a combination thereof. The planarization composition includes a halogen-containing compound and a halide salt. Herein, "a" or "an" or "the" mean "one or more" or "at least one." Thus, various combinations of halogen-containing compounds and halide salts can be used in the planarization compositions described herein.

In another aspect of the invention, there is provided a planarization method that includes: providing a semiconductor substrate or substrate assembly including at least one region of a platinum-containing surface; providing a polishing surface; providing a planarization composition at an interface between the at least one region of platinum-containing surface and the polishing surface; and planarizing the at least one region of platinum-containing surface; wherein the planarization composition includes a halogen-containing compound and a halide salt.

In yet another aspect of the invention, there is provided a planarization method that includes: positioning a metal-containing surface of a substrate to interface with a polishing surface, wherein the metal-containing surface includes a metal selected from the group consisting of a Group VIIIB metal, a Group IB metal, and a combination thereof; supplying a planarization composition in proximity to the interface; and planarizing the substrate surface. In this embodiment, the planarization composition includes: a halogen-containing compound selected from the group consisting of $F_2$, $Cl_2$, $Br_2$, $I_2$, ClBr, IBr, ICl, BrF, ClF, $ClF_3$, $BrF_3$, $ClF_5$, $IF_5$, $IF_7$, $XeF_2$, $HgF_2$, $SF_4$, alkyl halides, and complexes of $X_2$ with organic bases, and combinations thereof; and a halide salt selected from the group consisting of NaI, KCl, KBr, $NH_4F$, $Et_4NBr$, $Me_3NHCl$, $Me_4NF$, and combinations thereof.

In still another aspect of the invention, there is provided a planarization method that includes: providing a semiconductor substrate or substrate assembly including at least one region of a platinum-containing surface; providing a polishing surface; providing a planarization composition at an interface between the at least one region of platinum-containing surface and the polishing surface; and planarizing the at least one region of platinum-containing surface. In this embodiment, the planarization composition includes: a halogen-containing compound selected from the group consisting of $F_2$, $Cl_2$, $Br_2$, $I_2$, ClBr, IBr, ICl, BrF, ClF, $ClF_3$, $BrF_3$, $ClF_5$, $IF_5$, $IF_7$, $XeF_2$, $HgF_2$, $SF_4$, alkyl halides, and complexes of $X_2$ with organic bases, and combinations thereof; and a halide salt selected from the group consisting of NaI, KCl, KBr, $NH_4F$, $Et_4NBr$, $Me_3NHCl$, $Me_4NF$, and combinations thereof.

The present invention also provides a planarization method for use in forming an interconnect that includes: providing a semiconductor substrate or substrate assembly having a patterned dielectric layer formed thereon and a metal-containing layer formed over the patterned dielectric layer, wherein the metal-containing layer includes a metal selected from the group consisting of a Group VIIIB metal, a Group IB metal, and a combination thereof; positioning a first portion of a polishing surface for contact with the metal-containing layer; providing a planarization composition in proximity to the contact between the polishing surface and the metal-containing layer; and planarizing the metal-containing layer; wherein the planarization composition includes a halogen-containing compound and a halide salt.

The present invention further provides a planarization method for use in forming an interconnect that includes: providing a semiconductor substrate or substrate assembly having a patterned dielectric layer formed thereon and a metal-containing layer formed over the patterned dielectric layer, wherein the metal-containing layer includes a metal selected from the group consisting of a Group VIIIB metal, a Group IB metal, and a combination thereof; positioning a first portion of a polishing surface for contact with the metal-containing layer; providing a planarization composition in proximity to the contact between the polishing surface and the metal-containing layer; and planarizing the metal-containing layer. In this embodiment, the planarization composition includes: a halogen-containing compound selected from the group consisting of $F_2$, $Cl_2$, $Br_2$, $I_2$, ClBr, IBr, ICl, BrF, ClF, $ClF_3$, $BrF_3$, $ClF_5$, $IF_5$, $IF_7$, $XeF_2$, $HgF_2$, $SF_4$, alkyl halides, and complexes of $X_2$ with organic bases, and combinations thereof; and a halide salt selected from the group consisting of NaI, KCl, KBr, $NH_4F$, $Et_4NBr$, $Me_3NHCl$, $Me_4NF$, and combinations thereof.

As used herein, "semiconductor substrate or substrate assembly" refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

DESCRIPTION OF THE PREFERRED EMBODIMENTS

Figure 1A:
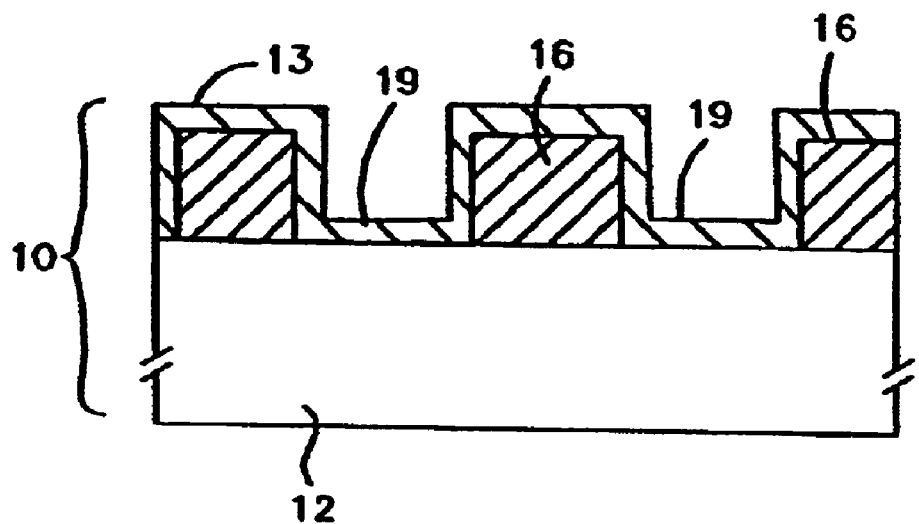
FIGS. 1A and 1B are cross-sectional illustrations of one portion of a wafer before and after a planarization process has been performed in accordance with the present invention.

The present invention provides methods of planarization of a surface that includes platinum and/or one or more of the other Group VIIIB and/or Group IB metals. The Group VIIIB metals are also referred to as the Group VIII elements or transition metals of Groups 8, 9, and 10 of the Periodic Table. The Group IB metals include the copper triad (Cu, Ag, and Au). The second and third row metals of Groups IB and VIIIB are preferred and include Rh, Ru, Ir, Pd, Pt, Os, Au, and Ag. Particularly preferred surfaces that can be planarized according to methods of the present invention include Rh, Ru, Ir, Pd, and/or Pt. Such a surface is referred to herein as a metal-containing surface (this refers to those containing second and/or third row transition metals).

Herein, a "metal-containing surface" includes an exposed region having a metal present. In such an exposed region, the metal is preferably present in an amount of at least about 10 atomic percent, more preferably at least about 20 atomic percent, and most preferably at least about 50 atomic percent, of the composition of the region, which may be provided as a layer, film, coating, etc., to be planarized (e.g., via chemical-mechanical or mechanical planarization or polishing) in accordance with the present invention.

The planarization of such surfaces, particularly a surface that includes platinum, typically involves mechanical methods with relatively hard particles such as alumina ($Al_2O_3$) and/or silica ($SiO_2$) particles, which can cause smearing and the formation of defects rather than the clean removal of the material. Surprisingly, the use of a planarization composition that includes a halogen-containing compound and a halide either in combination with a plurality of abrasive particles in the composition or with a fixed abrasive article reduces, and often eliminates, the problem of defect formation.

The planarization composition can be used in slurry planarization (i.e., in a conventional planarization process in which the planarization composition includes the abrasive particles with a polishing pad that does not include abrasive particles) or in fixed abrasive planarization. Thus, as used herein, a "polishing surface" refers to a polishing pad or a fixed abrasive article. Preferably, slurry planarization is used in the methods of the present invention. Preferably, when present in the planarization composition, the composition includes the abrasive particles in an amount of about 1% by weight to about 30% by weight, and more preferably, about 1% by weight to about 15% by weight, based on the total weight of the composition.

A wide variety of abrasive particles can be used either in an abrasive slurry or in a fixed abrasive article. Typically, such abrasive particles range in particle size (i.e., the largest dimension of the particle) on average from about 10 nanometers (nm) to about 5000 nm, and more often about 30 nm to about 1000 nm. For preferred embodiments, suitable abrasive particles have an average particle size of about 100 nm to about 300 nm.

Examples of suitable abrasive particles include, but are not limited to, alumina ($Al_2O_3$), silica ($SiO_2$), ceria ($CeO_2$), titania ($TiO_2$), zirconia ($ZrO_2$), manganese dioxide ($MnO_2$), tantalum dioxide ($TaO_2$), and niobium oxide ($NbO_2$). Preferred abrasive particles include alumina ($Al_2O_3$), silica ($SiO_2$), ceria ($CeO_2$), titania ($TiO_2$), and zirconia ($ZrO_2$). Various combinations of abrasive particles can be used if desired.

In certain methods in accordance with the present invention, preferably, a majority of the plurality of abrasive particles (either in an abrasive slurry or in a fixed abrasive article) are $Al_2O_3$ particles.

The planarization composition includes a halogen-containing compound and a halide salt therein (dissolved or dispersed therein). Preferred such compounds form $X_3^-$ species in situ. Although not intending to be limiting, it is believed that this species is the chemically reactive species that assists in removal of the metal.

A preferred group of halogen-containing compounds include the halogens, the interhalogens, and halogen-generating compounds. The halogens include $F_2$, $Cl_2$, $Br_2$, and $I_2$. The interhalogens generally exist in four stoichiometries: XY, $XY_3$, $XY_5$, and $XY_7$, where X is the heavier halogen. A few ternary compounds are also known, such as $IFCl_2$ and $IF_2Cl$. For the hexatomic series, only the fluorides are known. Preferred interhalogen compounds for use in the present invention include, for example, ClBr, IBr, ICl, BrF, ClF, $ClF_3$, $BrF_3$, $ClF_5$, $IF_5$, and $IF_7$. The halogen-generating compounds include $XeF_2$, $HgF_2$, $SF_4$, alkyl halides, and complexes of $X_2$ with organic bases, such as $NR_3$ (wherein R is an organic group, preferably a $C_1$–$C_{30}$ organic group), dioxane, crown ethers, azacrowns, etc.

A more preferred group of halogen-containing compounds includes $XeF_2$, $Br_2$, $Cl_2$, and $I_2$. A most preferred group of halogen-containing compounds includes $XeF_2$ and $Br_2$. The halogen-containing compounds may be solid, liquid, or gas at room temperature. Preferably, they are soluble in a liquid medium used in the planarization composition. Various combinations of such halogen-containing compounds can be used.

Preferably, the halogen-containing compound is present in the composition in an amount of at least about 0.1% by weight, and more preferably, in an amount of no greater than about 50% by weight, based on the total weight of the composition. Most preferably, the halogen-containing compound is present in the composition in an amount of about 1% to about 10% by weight, based on the total weight of the composition.

The halide salts can be inorganic salts (e.g., NaI, KCl, KBr, and $NH_4F$) or organic salts (e.g., $Et_4NBr$, $Me_3NHCl$, and $Me_4NF$). A preferred group of halide salts includes KBr, KCl, and $NH_4F$. The halide salts are typically solids at room temperature. Various combinations of such halogen-containing compounds can be used.

Preferably, the halide salt is present in the composition in an amount of at least about 0.1% by weight, and more preferably, in an amount of no greater than about 50% by weight, based on the total weight of the composition. Most preferably, the halide salt is present in the composition in an amount of about 1% to about 10% by weight, based on the total weight of the composition.

The halogen-containing compound(s) and halide salt(s) are typically dissolved in, although they may be dispersed in, a liquid medium in the planarization composition. The liquid medium is typically water, although organic liquids such as methanol, acetonitrile, acetone, glycols may be used, particularly if used in a mixture with water. Various combinations of liquids can be used if desired.

Other additives can be included as well for desired effects. For example, to enhance stability of a composition of the present invention surfactants, chelating agents, phase transfer catalysts, emulsifiers, or other solvents can be used. Surfactants (e.g., polyethylene glycol, polyoxy ethylene ether, or polypropylene glycol) can also be used to enhance wettability and reduce friction. Other additives include, but are not limited to, thickeners (e.g., CARBOPOL) to achieve a desired viscosity and buffering agents (e.g., organic acid salts) to achieve a desired pH. Preferably, the composition is an aqueous solution of these components.

For certain embodiments, the planarization composition includes a plurality of abrasive particles. For other embodiments, the planarization composition is essentially free of abrasive particles when supplied to the interface of a fixed abrasive article and the workpiece surface. However, in these latter embodiments, it is contemplated that planarization is accomplished by one or both of the fixed abrasive article and/or abrasive particles that may be removed from the fixed abrasive article at the fixed abrasive/surface interface in combination with the planarization composition. In any event, abrasive particles are typically not present in the composition as initially applied, i.e., they are not supplied from a source external to the polishing interface.

Preferably, a method in accordance with the present invention is conducted at atmospheric pressure and at a temperature of about 40° F. (about 4° C.) to about 145° F. (about 62° C.), and more preferably at a temperature of about 24° C. to about 115° F. (46° C.). In many instances, however, it would be desirable to maintain a temperature at or below ambient temperature during planarization of metal with a fixed abrasive article. This is seldom practical in slurry planarization (i.e., in a conventional planarization process in which the planarization composition includes the abrasive particles) where a lower slurry temperature likely results in poor dispersion of abrasive particles in the slurry composition during planarization. Accordingly, elevated temperatures are typically utilized during slurry planarization, although too high a temperature could result in too low a concentration of oxidizing gas in the planarization composition.

Various planarization assemblies or units for performing methods of the invention are readily available and are clearly contemplated by the scope of the present invention as described in the accompanying claims. Such planarization assemblies can create an interface between a polishing pad or a fixed abrasive article and the substrate surface (e.g., wafer surface) in various manners, e.g., rotation, movement, pressure, etc., to achieve planarization. A planarization composition is typically introduced at or near the interface, by a variety of methods such as by dripping, spraying, or other dispensing means, or by presoaking a polishing pad, although other locations and methods of introduction can be used.

In a typical planarizing machine, a polishing pad is fixed on a platen or table, a carrier assembly that includes a substrate holder to support the substrate (e.g., wafer) typically using suction, and a drive assembly to rotate and/or reciprocate the platen and/or a drive assembly to rotate and/or translate the substrate holder during planarization. Thus, conventional planarizing machines rotate the carrier assembly, the polishing pad, or both the carrier assembly and the polishing pad. In general, the planarizing machines are used to produce a planarization reaction product at the surface of a substrate whose hardness is less than the hardness of the abrasive particles and whose adhesion to the substrate is less than the original surface material; and to remove the reaction product using the abrasive particles.

Typically, the polishing pads, with or without abrasive particles embedded therein, are disk-shaped and rotatable about a fixed plane and axis at constant or variable speeds. Typically, the speed of rotation ranges from about 2 revolutions per minute (rpm) to about 200 rpm.

Typically, a polishing pad is presoaked and continually rewet with the planarization composition. If the polishing pad does not include abrasive particles embedded therein, the planarization composition includes abrasive particles, which is then referred to as an abrasive slurry. The planarization composition may be applied to the interface between a polishing pad and a substrate surface using a variety of techniques. For example, the component parts of the composition may be applied separately and mixed at the interface or immediately before contacting the interface. The planarization composition can be applied by pumping it through the pad. Alternatively, it can be applied at the leading edge of the pad, although this may not provide uniform distribution of the planarization composition across the surface being planarized, which is desirable.

The polishing pad can be any of a wide variety of conventional polishing pads that are used with abrasive slurries. They can be made from a material such as polyurethane, polyester, acrylic, acrylic ester copolymers, polytetrafluoroethylene, polypropylene, polyethylene, cellulose, cellulose esters, polamides, polyimides, polysiloxane, polycarbonates, epoxides, phenolic resins, etc. They include, for example, a polyurethane-based foam material, wherein the foam cell walls of the pad aid in removal of reaction products at the wafer surface and the pores within the pad assist in supplying slurry to the pad/wafer interface. They can include convex or concave features, which can be formed by embossing a surface pattern. For example, a polishing pad can have continuous grooves in concentric ellipses in the surface of the pad for more uniform slurry delivery and more effective debris removal. Commercially available polishing pads can be obtained under the trade designations "URII," "Sycamore," and "Polytex" from Rodel, Phenix, Ariz. Examples of polishing pads are also disclosed in U.S. Pat. No. 6,039,633 (Chopra).

In general, a fixed abrasive article includes a plurality of abrasive particles dispersed within a binder that forms a three-dimensional fixed abrasive element that is adhered to one surface of a backing material. They are described, for example, in U.S. Pat. No. 5,692,950 (Rutherford, et al.) and International Patent Publication WO 98/06541. Commercially available fixed abrasive articles can be obtained from Tokyo Sumitsu Kageki and Ebera Corporation, both of Japan, and Minnesota Mining and Manufacturing Company (3M Company) of St. Paul, Minn. An example of a preferred fixed abrasive article is a ceria-based pad commercially available from 3M Company under the trade designation "SWR 159." Such fixed abrasive articles can be used with a planarization composition as described herein with or without abrasive particles in the planarization composition.

It is highly desirable to have a high polishing rate (i.e., the rate at which material is removed from the substrate) to reduce the duration of each planarizing cycle, the polishing rate is preferably uniform across the substrate to produce a uniformly planar surface. Preferably, the polishing rate is controlled to provide accurate, reproducible results. Also, preferably, the planarization process is carried out in one cycle (i.e., one step). That is, for the removal of any material from a particular surface, there is only one planarization cycle without any intervening rinse cycles. This planarization process is then typically followed by a post-planarization clean process in which abrasive particles are not used.

Figure 1B:
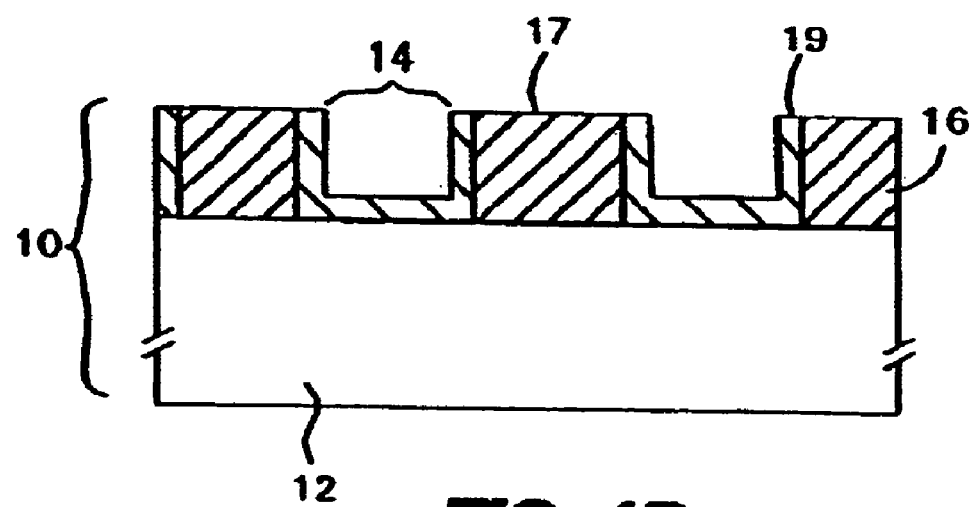

The figures provide further information about the methods of the invention. FIG. 1A illustrates one portion of a wafer 10 prior to planarization in accordance with the present invention. The wafer portion 10 includes a substrate assembly 12 having a patterned dielectric layer 16 formed thereon. Such a patterned dielectric layer 16 can be used in a variety of structures, particularly a capacitor structure. The patterned dielectric layer 16 can be formed of any material that provides electrical isolation between metal regions (e.g., silicon dioxide, silicon nitride, or BPSG). An electrode layer 19 is then formed over the substrate assembly 12 and the patterned dielectric layer 16. The electrode layer 19 may be platinum or any other suitable conductive second or third row Group VIIIB or Group IB metal-containing material. Generally, as shown in FIG. 1A, the nonplanar upper surface 13 of electrode layer 19 is subjected to planarization or other processing in accordance with the present invention. The resulting wafer 10, as shown in FIG. 1B, includes an upper surface 17 planarized such that the thickness of the wafer 10 is substantially uniform across the entire wafer 10 so that the wafer now includes electrically conducting regions 14 isolated within the patterned dielectric material 16 forming a capacitor structure.

FIG. 1 is shown only to illustrate a surface having nonuniformities, such as height differences, in the fabrication of semiconductor devices. The present invention is not limited to use with nonplanar surfaces. The present invention is also beneficial for use with substantially planar surfaces. For example, the methods in accordance with the present invention is beneficial during the whole planarization process, even at the end of the process when the surface being planarized is in a substantially planar state.

The following example is offered to further illustrate the various specific and preferred embodiments and techniques. It should be understood, however, that many variations and modifications may be made while remaining within the scope of the present invention.

EXAMPLE

A test sample was cut from a wafer containing a blanket layer of 2700 Å of sputtered platinum metal. Several locations on the sample were measured for sheet resistance before any polishing, directly correlating the metal thickness to the sheet resistance. A slurry was prepared by addition of 0.2 mL of $Br_2$ (Mallinckrodt Specialty Chemicals, Paris, Ky.) and 0.43 g of KBr (Aldrich Chemical Co., Milwaukee, Wis.) to 30 mL of Rodel CMP slurry containing $Al_2O_3$ as the abrasive. The sample was fixed to the carrier on a Beuhler Minimet 1000 polisher and was polished on a Rodel polishing pad upon which several milliliters of the prepared slurry was added. Polishing was carried out using a pressure of 15 pounds and a speed of 50 revolutions per minute (rpm). After 2 minutes the sample was rinsed and dried, and the sheet resistance measured again. The higher sheet resistance values yielded a calculated estimate of 900 Å of film removed (or a removal rate of approximately 450 Å per minute). By comparison, the same slurry without the added halogen and halide salt yielded little change in the sheet resistance of a similar sample, and caused only scratches and some areas of film delaminated from the substrate.

The foregoing detailed description and example have been given for clarity of understanding only. No unnecessary limitations are to be understood therefrom. The invention is not limited to the exact details shown and described, for variations obvious to one skilled in the art will be included within the invention defined by the claims. For example, while the description above focused on planarization of semiconductor-based substrates, the compositions and methods of the invention are also applicable to, for example, polishing glasses and contact lenses, as one of many other possible applications. The complete disclosures of all patents, patent documents, and publications listed herein are incorporated by reference, as if each were individually incorporated by reference.

What is claimed is:

1. A planarization method comprising:
    providing a semiconductor substrate or substrate assembly including at least one region of a platinum-containing surface;
    providing a polishing surface comprising a fixed abrasive article;
    providing a planarization composition at an interface between the at least one region of platinum-containing surface and the polishing surface; and
    planarizing the at least one region of platinum-containing surface;
    wherein the planarization composition comprises a halogen-containing compound and a halide salt.

2. A planarization method comprising:
    positioning a metal-containing surface of a substrate to interface with a polishing surface comprising a fixed abrasive article, wherein the metal-containing surface comprises a metal selected from the group consisting of a Group VIIIB metal, a Group IB metal, and a combination thereof;
    supplying a planarization composition in proximity to the interface; and
    planarizing the substrate surface;
    wherein the planarization composition comprises a halogen-containing compound and a halide salt.

3. A planarization method for use in forming an interconnect, the method comprising:
    providing a semiconductor substrate or substrate assembly having a patterned dielectric layer formed thereon and a metal-containing layer formed over the patterned dielectric layer, wherein the metal-containing layer comprises a metal selected from the group consisting of a Group VIIIB metal, a Group IB metal, and a combination thereof;

positioning a first portion of a polishing surface comprising a fixed abrasive article for contact with the metal-containing layer;

providing a planarization composition in proximity to the contact between the polishing surface and the metal-containing layer; and planarizing the metal-containing layer;

wherein the planarization composition comprises a halogen-containing compound and a halide salt.

4. A planarization method comprising:

positioning a metal-containing surface of a substrate to interface with a polishing surface, wherein the metal-containing surface comprises a metal selected from the group consisting of a Group VIIIB metal, a Group IB metal, and a combination thereof;

supplying a planarization composition in proximity to the interface; and planarizing the substrate surface;

wherein the planarization composition comprises a halogen-containing compound and a halide salt, with the proviso that the planarization composition does not include abrasive particles.

5. The method of claim 4 wherein the metal-containing surface of the substrate comprises a metal selected from the group consisting of a Group VIIIB metal, a Group IB metal, and a combination thereof, which is in elemental form or an alloy thereof.

6. The method of claim 4 wherein the metal-containing surface of the substrate comprises a metal selected from the group consisting of a Group VIIIB second row metal, a Group VIIIB third row metal, a Group IB second row metal, a Group IB third row metal, and a combination thereof.

7. The method of claim 6 wherein the metal-containing surface of the substrate comprises a metal selected from the group consisting of Rh, Pd, Pt, Ir, and Ru.

8. The method of claim 7 wherein the metal-containing surface comprises elemental platinum.

9. The method of claim 4 wherein the metal is present in an amount of about 50 atomic percent or more.

10. The method of claim 4 wherein the substrate is a semiconductor substrate or substrate assembly.

11. The method of claim 4 which is carried out in one step.

12. The method of claim 4 wherein the halogen-containing compound is selected from the group consisting of a halogen, an interhalogen, a halogen-generating compound, and combinations thereof.

13. The method of claim 4 wherein the halogen-containing compound is selected from the group consisting of a halogen; an interhalogen; a halogen-generating compound selected from the group consisting of $XeF_2$, $HgF_2$, $SF_4$, alkyl halides, and complexes of halogen with organic bases; and combinations thereof.

14. The method of claim 4 wherein the halogen-containing compound is selected from the group consisting of $F_2$, $Cl_2$, $Br_2$, $I_2$, ClBr, IBr, ICl, BrF, ClF, $ClF_3$, $BrF_3$, $ClF_5$, $IF_5$, $IF_7$, $XeF_2$, $HgF_2$, $SF_4$, alkyl halides, and complexes of halogen with organic bases, and combinations thereof.

15. The method of claim 4 wherein the halogen-containing compound is selected from the group consisting of ClBr, IBr, ICl, BrF, ClF, $ClF_3$, $BrF_3$, $ClF_5$, $IF_5$, $IF_7$, $XeF_2$, $HgF_2$, $SF_4$, alkyl halides, and complexes of halogen with organic bases, and combinations thereof.

16. The method of claim 4 wherein the halide salt is an inorganic salt.

17. The method of claim 16 wherein the inorganic halide salt is selected from the group consisting of NaI, KCl, KBr, $NH_4F$, and combinations thereof.

18. The method of claim 4 wherein the halide salt is an organic salt.

19. The method of claim 18 wherein the organic salt is selected from the group consisting of $Et_4NBr$, $Me_3NHCl$, $Me_4NF$, and combinations thereof.

20. The method of claim 4 wherein the halogen-containing compound is present in the planarization composition in an amount of at least about 0.1% by weight and the halide salt is present in the planarization composition in an amount of at least about 0.1% by weight.

21. The method of claim 4 wherein the halogen-containing compound is present in the planarization composition in an amount of about 1% to about 10% by weight.

22. The method of claim 4 wherein the halide salt is present in the planarization composition in an amount of about 1% to about 10% by weight.

23. The method of claim 4 wherein the halogen of the halogen-containing compound is different than the halogen of the halide salt.

24. The method of claim 4 wherein the planarization composition is not basic.

25. The method of claim 4 wherein the polishing surface comprises a fixed abrasive article.

26. A planarization method comprising:

providing a semiconductor substrate or substrate assembly including at least one region of a platinum-containing surface;

providing a polishing surface;

providing a planarization composition at an interface between the at least one region of platinum-containing surface and the polishing surface; and planarizing the at least one region of platinum-containing surface;

wherein the planarization composition comprises a halogen-containing compound and a halide salt, with the proviso that the planarization composition does not include abrasive particles.

27. The method of claim 26 wherein the platinum-containing surface of the substrate comprises platinum in elemental form.

28. The method of claim 26 wherein the platinum is present in an amount of about 50 atomic percent or more.

29. The method of claim 26 wherein the semiconductor substrate or substrate assembly is a silicon wafer.

30. The method of claim 26 wherein the halogen-containing compound is selected from the group consisting of a halogen, an interhalogen, a halogen-generating compound, and combinations thereof.

31. The method of claim 26 wherein the halogen-containing compound is selected from the group consisting of a halogen; an interhalogen; a halogen-generating compound selected from the group consisting of $XeF_2$, $HgF_2$, $SF_4$, alkyl halides, and complexes of halogen with organic bases; and combinations thereof.

32. The method of claim 26 wherein the halogen-containing compound is selected from the group consisting of $F_2$, $Cl_2$, $Br_2$, $I_2$, ClBr, IBr, ICl, BrF, ClF, $ClF_3$, $BrF_3$, $ClF_5$, $IF_5$, $IF_7$, $XeF_2$, $HgF_2$, $SF_4$, alkyl halides, and complexes of halogen with organic bases, and combinations thereof.

33. The method of claim 26 wherein the halide salt is an inorganic salt.

34. The method of claim 33 wherein the inorganic halide salt is selected from the group consisting of NaI, KCl, KBr, $NH_4F$ and combinations thereof.

35. The method of claim 26 wherein the halide salt is an organic salt.

36. The method of claim 35 wherein the organic salt is selected from the group consisting of $Et_4NBr$, $Me_3NHCl$, $Me_4NF$, and combinations thereof.

37. The method of claim 26 wherein the halogen-containing compound is present in the planarization composition in an amount of at least about 0.1% by weight and the halide salt is present in the planarization composition in an amount of at least about 0.1% by weight.

38. The method of claim 26 wherein the halogen-containing compound is present in the planarization composition in an amount of about 1% to about 10% by weight.

39. The method of claim 26 wherein the halide salt is present in the planarization composition in an amount of about 1% to about 10% by weight.

40. The method of claim 26 wherein the polishing surface comprises a fixed abrasive article.

41. A planarization method for use in forming an interconnect, the method comprising:
providing a semiconductor substrate or substrate assembly having a patterned dielectric layer formed thereon and a metal-containing layer formed over the patterned dielectric layer, wherein the metal-containing layer comprises a metal selected from the group consisting of a Group VIIIB metal, a Group IB metal, and a combination thereof;
positioning a first portion of a polishing surface for contact with the metal-containing layer;
providing a planarization composition in proximity to the contact between the polishing surface and the metal-containing layer; and
planarizing the metal-containing layer;
wherein the planarization composition comprises a halogen-containing compound and a halide salt, with the proviso that the planarization composition does not include abrasive particles.

42. The method of claim 41 wherein the halogen-containing compound is selected from the group consisting of a halogen, an interhalogen, a halogen-generating compound, and combinations thereof.

43. The method of claim 41 wherein the halogen-containing compound is selected from the group consisting of a halogen; an interhalogen; a halogen-generating compound selected from the group consisting of $XeF_2$, $HgF_2$, $SF_4$, alkyl halides, and complexes of halogen with organic bases; and combinations thereof.

44. The method of claim 41 wherein the halogen-containing compound is selected from the group consisting of $F_2$, $Cl_2$, $Br_2$, $I_2$, ClBr, IBr, ICl, BrF, ClF, $ClF_3$, $BrF_3$, $ClF_5$, $IF_5$, $IF_7$, $XeF_2$, $HgF_2$, $SF_4$, alkyl halides, and complexes of halogen with organic bases, and combinations thereof.

45. The method of claim 41 wherein the halide salt is an inorganic salt.

46. The method of claim 45 wherein the inorganic halide salt is selected from the group consisting of NaI, KCl, KBr, $NH_4F$ and combinations thereof.

47. The method of claim 41 wherein the halide salt is an organic salt.

48. The method of claim 47 wherein the organic salt is selected from the group consisting of $Et_4NBr$, $Me_3NHCl$, $Me_4NF$, and combinations thereof.

49. The method of claim 41 wherein the halogen-containing compound is present in the planarization composition in an amount of at least about 0.1% by weight.

50. The method of claim 49 wherein the halogen-containing compound is present in the planarization composition in an amount of about 1% to about 10% by weight.

51. The method of claim 41 wherein the halide salt is present in the planarization composition in an amount of at least about 0.1% by weight.

52. The method of claim 51 wherein the halide salt is present in the planarization composition in an amount of about 1% to about 10% by weight.

53. The method of claim 41 wherein the polishing surface comprises a fixed abrasive article.

* * * * *